(12) United States Patent
Kubo et al.

(10) Patent No.: US 7,208,113 B2
(45) Date of Patent: Apr. 24, 2007

(54) SEALING MATERIAL TABLET METHOD OF MANUFACTURING THE TABLET AND ELECTRONIC COMPONENT DEVICE

(75) Inventors: Katsumi Kubo, Ibaraki-ken (JP); Takashi Inagawa, Shimotsuma (JP); Hiroshi Terada, Oyama (JP); Akio Ono, Tochigi-ken (JP); Hiroshi Masubuchi, Shimodate (JP); Tateo Yamada, Yuki (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/487,668

(22) PCT Filed: Oct. 24, 2002

(86) PCT No.: PCT/JP02/11029

§ 371 (c)(1),
(2), (4) Date: Sep. 15, 2004

(87) PCT Pub. No.: WO03/037589

PCT Pub. Date: May 8, 2003

(65) Prior Publication Data

US 2005/0040561 A1 Feb. 24, 2005

(30) Foreign Application Priority Data

Oct. 30, 2001 (JP) .............................. 2001-332843

(51) Int. Cl.
   B28B 1/32 (2006.01)
   B28B 13/02 (2006.01)
   B32B 5/16 (2006.01)

(52) U.S. Cl. .............. 264/226; 309/328.2; 309/331.11; 309/338; 428/407

(58) Field of Classification Search ................ 264/226, 264/309, 328.2, 331.11, 338; 428/402, 407
See application file for complete search history.

(56) References Cited

U.S. PATENT DOCUMENTS 4,284,746 A * 8/1981 Ohmori ....................... 525/510

(Continued)

FOREIGN PATENT DOCUMENTS

| JP | 07117048 | 5/1995 |
|----|----------|--------|
| JP | 08323745 | 12/1996 |
| JP | 09057749 | 3/1997 |

(Continued)

Primary Examiner—H. Thi Le
(74) Attorney, Agent, or Firm—Antonelli, Terry, Stout and Kraus, LLP.

(57) ABSTRACT

To provide a method of producing an encapsulating molding material tablet by which adhesion of an encapsulating molding material to the punch surface of a tablet forming machine can be reduced, an encapsulating molding material tablet produced by this method, and an electronic part apparatus equipped with an element encapsulated using this encapsulating molding material tablet. A method of producing an encapsulating molding material tablet in which a release agent dissolved in a solvent is fed to the punch surface of a tablet forming machine to form a release agent layer having a thickness of over 0.001 μm and less than 0.07 μm on the above-mentioned punch surface, then, an encapsulating molding material is fed to the above-mentioned tablet forming machine for molding the material, an encapsulating molding material tablet produced by this method or having a contact angle ratio of 1.15 or more and less than 1.35, and an electron part apparatus equipped with an element encapsulated using this encapsulating molding material tablet.

27 Claims, 4 Drawing Sheets

U.S. PATENT DOCUMENTS

| | | | | |
|---|---|---|---|---|
| 4,353,522 A | * | 10/1982 | Anger | 249/144 |
| 4,656,066 A | * | 4/1987 | Wittwer | 428/34.1 |
| 5,180,845 A | * | 1/1993 | Higley | 556/445 |
| 6,187,243 B1 | * | 2/2001 | Miyajima | 264/272.15 |
| 6,562,898 B2 | * | 5/2003 | Masumoto | 524/580 |

FOREIGN PATENT DOCUMENTS

| | | |
|---|---|---|
| JP | 09193149 | 7/1997 |
| JP | 11335445 | 12/1999 |
| JP | 233937 | 8/2001 |

\* cited by examiner

SEALING MATERIAL TABLET METHOD OF MANUFACTURING THE TABLET AND ELECTRONIC COMPONENT DEVICE

This application claims priority based on Japanese Patent Application filed previously by the same applicant, namely, Japanese Patent Application No. 2001-332843 (application date: Oct. 30, 2001), and the specification thereof is incorporated herein by reference.

FIELD OF THE INVENTION

The present invention relates to an encapsulating molding material tablet, a method of producing the same and an electronic part apparatus equipped with an element encapsulated using the encapsulating molding material tablet.

BACKGROUND TECHNOLOGY

Conventionally, in electronic part apparatuses such as semiconductor apparatuses and the like, an element is encapsulated for the purpose of protecting elements such as transistors, IC and the like from the outer environments, and making mounting on a substrate easy. In the field of this element encapsulation, encapsulation with a resin is mainly used from the standpoints of productivity, cost and the like and encapsulating molding materials using thermo-setting resins are widely used. Particularly, encapsulation methods such as transfer molding using an encapsulating molding material in the form of powder, and the like are excellent in economy and productivity, and said to be suitable for mass production. Encapsulating molding materials in the form of powder are often tablet-formed into a cylindrical encapsulating molding material tablet of weight and dimension corresponding to the requirements by clients.

In encapsulating an element of an electronic part apparatus using an encapsulating molding material tablet, reduction in generation of voids inside is required for improving its molding property and reflow crack resistance. Therefore, high density of an encapsulating molding material tablet is required, and the forming pressure in forming a tablet tends to be increased.

However, when the forming pressure in forming a tablet increases, an encapsulating molding material easily adheres to the punch surface of a tablet forming machine. When a biphenyl type epoxy resin excellent in reflow crack resistance is used as an encapsulating molding material, an encapsulating molding material easily adheres to the punch surface irrespective of the forming pressure in forming a tablet. When an encapsulating molding material is partially adhered to the punch surface of a tablet forming machine, there occurs a problem of production of an encapsulating molding material tablet of which surface is partially missed. In generation of such adhesion, a tablet forming machine is stopped, the punch surface is manually cleaned to remove the adhered substance, leading to remarkable decrease in productivity.

As a method of preventing adhesion of an encapsulating molding material to the punch surface of a tablet forming machine, a release agent has been tried to be baking-applied on the punch surface of a tablet forming machine, leading, however, to only an insufficient effect. Further, a method of adding a release agent to an encapsulating molding material and a method of coating a silicone-based release agent having specific thickness on the punch surface (JP-A No. 9-193149) have been suggested, however, there are problems regarding the reliability of an encapsulating molding material such as poor appearance of stain observed on the appearance of a tablet, lowering in reflow resistance, and the like though adhesion is partially improved.

The present invention has been accomplished in view of such conditions, and an object thereof is to provide a method of producing an encapsulating molding material tablet by which adhesion of an encapsulating molding material to the punch surface of a tablet forming machine can be reduced, an encapsulating molding material tablet produced by this method, and an electronic part apparatus equipped with an element encapsulated using this encapsulating molding material tablet.

SUMMARY OF THE INVENTION

The present inventors have intensively studied to solve the above-mentioned problems, and carried out various investigations such as heating of an encapsulating molding material in forming a tablet, cooling of a punch of a tablet forming machine, formation of a release agent layer on the punch surface, and the like. As a result, the present inventors have found that the above-mentioned object can be attained by forming a release agent layer having specific thickness on the punch surface of a tablet forming machine using a release agent dissolved in a solvent then, tablet-forming an encapsulating molding material fed to the above-mentioned tablet forming machine, leading to completion of the present invention.

Namely, the present invention relates to the following matters.

1. A method of producing an encapsulating molding material tablet comprising: feeding an encapsulating molding material to a forming metal die and compression-forming the material by upper and lower punches,
   wherein a release agent layer having a thickness greater than 0.001 μm and less than 0.07 μm is provided on a contact surface of at least one of the upper and lower punches with an encapsulating molding material, for compression forming.
2. The method of producing an encapsulating molding material tablet according to Embodiment 1, wherein the release agent contains at least one of fluorine-based release agents and silicone-based release agents.
3. The method of producing an encapsulating molding material tablet according to Embodiment 2, wherein the fluorine-based release agent is at least one of perfluoroalkyl-containing polymers and polytetrafluoroethylene.
4. The method of producing an encapsulating molding material tablet according to Embodiment 2, wherein the silicone-based release agent is carboxyl group-modified dimethylpolysiloxane.
5. The method of producing an encapsulating molding material tablet according to any one of Embodiment 1 to 4, wherein a release agent dissolved in a solvent is fed to the contact surface of the upper and lower punches with an encapsulating molding material, to provide a release agent layer.
6. The method of producing an encapsulating molding material tablet according to Embodiment 5, wherein the solvent has no flammability.
7. An encapsulating molding material tablet produced by the production method according to any one of Embodiment 1 to 6.
8. An encapsulating molding material tablet having a contact angle ratio of at least 1.15 and less than 1.35.

9. An electron part apparatus equipped with an element encapsulated using the encapsulating molding material tablet according to Embodiment 7 or 8.

DESCRIPTION OF MARKS

Figure 1:
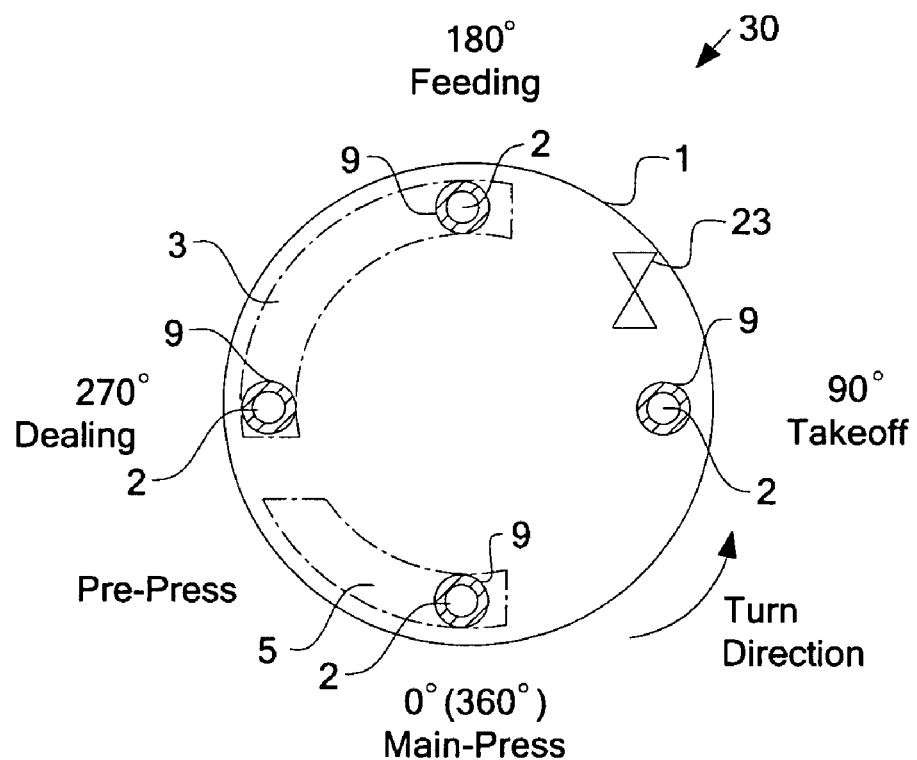
FIG. 1 is a view showing a process of producing an encapsulating molding material tablet using the top schematic view of a rotary type tablet forming machine 30.

1: turntable
2: penetration port
3: material feeding and dealing station
5: pressurizing station
6: hopper
7: encapsulating molding material
8: feed shoe
9: die
10: lower punch
11: lowering guide
12: dealing jack
13: upper punch
14a, 14b: rail
15a, 15b: pre-press roll
16a, 16b: holder
17: supporting stand
18a, 18b: main-press roll
19: load cell
20: extrusion roll
21: encapsulating molding material tablet
22: takeoff guide
23: release agent spraying apparatus
24: release agent layer
25: compressed surface by forming machine punch
26: cylindrical surface
27: plane including punch surface
28: release agent solution
30: rotary type tablet forming machine

PREFERABLE EMBODIMENTS FOR CARRYING OUT THE INVENTION

The encapsulating molding material used in the present invention is one which is used in general as an encapsulating molding material, containing a thermosetting resin such as an epoxy resin, cyanate ester resin and the like, and a hardener, an inorganic filler and the like without specific limitation, and which may also contain a thermoplastic resin.

As the encapsulating molding material, it is preferable to use an epoxy resin from the standpoints of electric property, moisture resistance, heat resistance, mechanical property, adhesion with an insert article, and the like. As the epoxy resin, those generally used in encapsulating epoxy resin molding materials can be used without specific restriction, and there are listed, for example, those obtained by epoxidizing novolak resins obtained by condensing or co-condensing phenols such as phenol, cresol, xylenol, resorcinol, catechol, bisphenol A, bisphenol F and the like and/or naphthols such as α-naphthol, β-naphthol, dihydroxynaphthalene and the like with compounds having an aldehyde group such as formaldehyde, acetaldehyde, propionaldehyde, benzaldehyde, salicylaldehyde and the like in the presence of an acidic catalyst, typically including phenol novolak type epoxy resins and ortho-cresol novolak type epoxy resins; aralkyl type epoxy resins obtained by epoxidizing bisphenol A, bisphenol F, bisphenol S, diglycidyl ethers such as alkyl-substituted or un-substituted biphenol and the like, stilbene type diglycidyl ether, phenol.aralkyl resins, naphthol.aralkyl resins; those obtained by epoxidizing adducts or poly-adducts of phenols with dicyclopentapunchne or terpenes; glycidyl ester type epoxy resins obtained by reaction of poly-basic acids such as phthalic acid, dimer acid and the like with epichlorohydrin; glycidylamine type epoxy resins obtained by reaction of polyamies such as diaminodiphenylmethane, isocyanuric acid and the like with epichlorohydrin; triemthylolpropane type epoxy resins, naphthalene type epoxy resins having a naphthalene ring, linear aliphatic epoxy resins obtained by oxidizing an olefin bond with a per-acid such as peracetic acid and the like, alicyclic epoxy resins and the like, and these may be used singly or in combination of two or more. Of them, biphenyl type epoxy resins, stilbene type epoxy resins and sulfur atom-containing epoxy resins are preferable from the standpoint of reflow resistance, novolak type epoxy resins are preferably from the standpoint of hardening property, dicyclopentapunchne type epoxy resins and naphthalene type epoxy resins are preferable from the standpoint of low hygroscopicity, naphthalene type epoxy resins and triphenylmethane type epoxy resins are preferable from the standpoint of heat resistance and low warping property, and it is preferable that at least one of these epoxy resins is contained.

The hardener used in an encapsulating molding material is one generally used in an encapsulating molding material and is not particularly restricted, and when an epoxy resin is used, preferable are phenol resins, amine compounds and acid anhydrides, and from the standpoint of storage stability, phenol resins are more preferable, and from the standpoint of adhesion, amine compounds are more preferable.

Listed as the phenol resin are, for example, novolak type phenol resins obtained by condensing or co-condensing phenols such as phenol, cresol, resorcinol, catechol, bisphenol A, bisphenol F, phenylphenol, aminophenol and the like and/or naphthols such as α-naphthol, β-naphthol, dihydroxynaphthalene and the like with compounds having an aldehyde group such as formaldehyde, benzaldehyde, salicylaldehyde and the like in the presence of an acidic catalyst; aralkyl type phenol resins such as phenol.aralkyl resins, naphthol.aralkyl resins and the like synthesized from phenols and/or naphthols and dimethoxy p-xylene; cyclopentapunchne type phenol resins such as cyclopentapunchne type phenol novolak resins, naphthol novolak resins and the like synthesized from phenols and/or naphthols and cyclopentapunchne by copolymerization; terpene-modified phenol resins and the like, and these may be used singly or in combination of two or more.

Of them, preferable from the standpoint of reflow resistance and hardening property are aralkyl type phenol resins, preferable from the standpoint of low hygroscopicity are dicyclopentapunchne type phenol resins, preferable from the standpoint of heat resistance, low expansion coefficient and low warping are triphenylmethane type phenol resins, and preferable from the standpoint of hardening property are novolak type phenol resins.

The amine compound is not particularly restricted, and aromatic amines which are amine compounds having an aromatic ring are preferable. Listed are, for example, 3,3'-punchthyl-4,4'-diaminodiphenylmethane, 3,3',5,5'-tetramethyl-4,4'-diaminodiphenylmethane, 3,3',5,5'-tetraethyl-4,4'-diaminodiphenylmethane, punchthyltoluenediamine and the like, and commercially available are EPICURE W, EPICURE Z (trade name, manufactured by Yuka Shell Epoxy K.K.), KAYAHARD A-A, KAYAHARD A-B, KAYAHARD A-S (trade name, manufactured by Nippon Kayaku Co., Ltd.), TOTO AMINEHM-205 (trade name, manufactured by Toto Kasei K.K.), ADEKA HARDENER EH-101 (trade name, manufactured by Asahi Denka Kogyo K.K.), EPOMIC Q-640, EPOMIX Q-643 (trade name, manufactured by Mitsui Chemical Co., Ltd.), DETDA80 (trade name, manufactured by Lonza) and the like. These may be used singly or in combination of two or more.

The acid anhydride is not particularly restricted and there are listed, for example, phthalic anhydride, tetrahydrophthalic anhydride, methyltetrahydrophthalic anhydride, hexahydrophthalic anhydride, methylhexahydrophthalic anhydride, endomethylenetetrahydrophthalic anhydride, methylendomethylenephthalic anhydride, trialkyltetrahydrophthalic anhydride, pyromellitic anhydride, trimellitic anhydride, nadic anhydride, hymic anhydride, succinic anhydride, dodecenylsuccinic anhydride, and the like, and these may be used singly or in combination of two or more.

The equivalent ratio of an epoxy resin to a hardener is not particularly restricted, and for suppressing respective unreacted components low, it is preferable that the equivalent of a hardener is set in the range from 0.5 to 2 based on an epoxy resin, and more preferably from 0.7 to 1.3 equivalent. For obtaining an encapsulating molding material excellent in reflow resistance, equivalents from 0.8 to 1.2 are further preferable.

Here, the equivalent of a phenol resin is calculated hypothesizing that one phenolic hydroxyl group is reacted with one epoxy group, and the equivalent of an amine compound is calculated hypothesizing that one active hydrogen of an amino group is reacted with one epoxy group, and the equivalent of an acid anhydride is calculated hypothesizing that one acid anhydride group is reacted with one epoxy group, In an encapsulating molding material of the present invention, a hardening accelerator can be used, if necessary. The hardening accelerator is one generally used in an encapsulating molding material and is not particularly restricted, and there are listed, for example, cycloamidine compounds such as 1,8-diaza-bicyclo(5,4,0)undecene-7,1,5-diaza-bicyclo(4,3,0)nonene, 5,6-dibutylamino-1,8-diaza-bicyclo(5,4,0)undecene-7 and the like; compounds having intra-molecular polarization obtained by addition to these compounds of maleic anhydride, quinone compounds such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, phenyl-1,4-benzoquinone and the like, or compounds having a π bond such as diazophenylmethane, phenol resins and the like; tertiary amines such as benzyldimethylamine, triethanolamine, dimethylaminoethanol, tris(dimethylaminomethyl)phenol and the like and derivatives thereof; imidazoles such as 2-methylimidazole, 2-phenylimidazole, 2-phenyl-4-methylimidazole and the like and derivatives thereof; phosphine compounds such as tributylphosphine, methyldiphenylphosphine, triphenylphosphine, tris(4-methylphenyl)phosphine, diphenylphosphine, phenylphoshpine and the like and phosphorus compounds having intra-molecular polarization obtained by addition to these phosphine compounds of maleic anhydride, the above-mentioned quinone compounds, diazophenylmethane, or comounds having a π bond such as diazophenylmethane, phenol resins and the like; tetraphenylboron salts such as tetrephenylphosphonium tetraphenyl borate, triphenylphosphine tetraphenyl borate, 2-ethyl-4-methylimidazole tetraphenyl borate, N-methylmorpholine tetraphenyl borate and the like and derivatives thereof, and these may be used singly or in combination of two or more.

Of them, preferable from the standpoints of hardening property and flowability are phosphine compounds and adducts of phosphine compounds with quinone compounds, and more preferable are tertiary phosphine compounds such as triphenylphosphine and the like and adducts of triphenylphosphine with quinone compounds. When a tertiary phosphine compound is used, it is preferable that a quinone compound is further contained. From the standpoint of storage stability, adducts of cycloamidine compounds with phenol resins are preferable, and phenol novolak resin salts of diazabicycloundecene are more preferable.

The compounding amount of a hardening accelerator is not particularly restricted providing an hardening acceleration effect is attained, and from the standpoints of hardening property and hardening speed, the compounding amount thereof is preferably from 0.005 to 2 wt %, more preferably from 0.01 to 0.5 wt % based on an encapsulating molding material.

In an encapsulating molding material of the present invention, an inorganic filler can be compounded, if necessary. The inorganic filler is compounded for hygroscopicity, decrease in linear expansion coefficient, improvement in heat conductivity and improvement in strength, and is one generally used in an encapsulating epoxy resin molding material and is not particularly restricted, and listed are, for example, powders of fused silica, crystalline silica, alumina, zircon, calcium silicate, calcium carbonate, potassium titanate, silicon carbide, silicon nitride, aluminum nitride, boron nitride, beryllia, zirconia, zircon, phostelite, steatitem, spinel, mulite, titania and the like, beads obtained by spheroidizing them, glass fibers and the like, and these may be used singly or in combination of two or more. Of them, preferable from the standpoint of decrease in linear expansion coefficient is fused silica and preferable from the standpoint of high heat conductivity is alumina, and it is preferable that a filler is in the form of sphere from the standpoints of flowability in molding and mold friction property.

The compounding amount of an inorganic filler is preferably from 70 wt % or more based on an encapsulating molding material from the standpoints of flame retardancy, molding property, hygroscopicity, lowering of linear expansion coefficient and improvement in strength, and preferably 95 wt % or less based on an encapsulating molding material from the standpoint of flowability. The compounding amount of an inorganic filler is more preferably from 75 to 94 wt %, further preferably from 80 to 92 wt %, particularly preferably from 85 to 92 wt %.

In an encapsulating molding material of the present invention, various additive such as red phosphorus, phosphates, melamine, melamine derivatives, compounds having a triazine ring, nitrogen-containing compounds such as cyanuric acid derivatives, isocyanuric acid derivatives and the like, phosphorus/nitrogen-containing compounds such as cyclophosphazene and the like, metal compounds such as zinc oxide, iron oxide, molybdenum oxide, ferrocene and the like, flame retardants such as antimony oxide, brominated resins and the like, ion trap agents such as hydrotalcites and water-containing oxides of elements selected from magnesium, aluminum, titanium, zirconium and bismuth, and the like, coupling agents such as epoxysilane, aminosilane, ureidesilane, vinylsilane, alkylsilane, organotitanate, aluminum alcoholate and the like, release agents such as higher fatty acids, higher fatty metal salts, ester-based waxed, polyolefin-based waxes, polyethylene, polyethylene oxide and the like, stress relaxing agents such as silicone oil, silicone rubber powder and the like, coloring agents such as dyes, carbon black and the like, can be compounded, if necessary.

Encapsulating molding materials in the form of powder or sheet can be prepared by weighing various compounding components as described above in given compounding amount, if necessary pre-mixing them in a mixer and the like, then, heat-kneading the mixture using a general method effecting kneading by a mixing roll, extrude, crusher and the like. Various compounding components may be all added simultaneously, however, the addition order may be appropriately set. If necessary, various compounding components can be pre-kneaded. For example, an epoxy resin and hardener, a hardener and hardening accelerator, an epoxy resin and/or hardener and release agent, an epoxy resin and/or hardener and stress relaxing agent, a filler and coupling agent, and the like may be pre-kneaded at room temperature or under heat.

By forming in a tablet forming machine of the resulted encapsulating molding material, an encapsulating molding material tablet is produced. Namely, an encapsulating molding material is cooled, if necessary ground by a hammer mill and the like to obtain uniform particle size, then, the particles are tabletted using a tablet forming machine to give dimension and weight matching the forming conditions depending on the use object.

In the present invention, a release agent dissolved in a solvent is fed to the contact surface of a punch of a tablet forming machine with an encapsulating molding material (in this specification, "contact surface of a punch of a tablet forming machine with an encapsulating molding material" is called "punch surface"), to form a release agent layer on the above-mentioned punch surface, then, the encapsulating molding material fed to the above-mentioned tablet forming machine is tablet-formed, to produce an encapsulating molding material tablet.

The release agent used in the present invention is not particularly restricted, and there are listed, for example, silicone-based release agents such as organopolysiloxane and the like having dimethylpolysiloxane as the main component, fluorine-based release agents such as polytetrafluoroethylene, perfluoroalkyl-containing polymers and the like, alcohol-based release agents such as polyvinyl alcohol and the like, waxes such as paraffin, higher fatty acids, higher fatty metal salts, ester-based waxes, polyolefin-based waxes, polyethylene, polyethylene oxide and the like, and these may be used singly or in combination of two or more. Of them, preferable from the standpoint of solubility in a solvent are silicone-based release agents and fluorine-based release agents, and fluorine-based release agents are more preferable from the standpoint of releasing property. Of silicone-based release agents, preferable are carboxyl group-modified dimethylpolysiloxanes, and of fluorine-based release agents, preferable are perfluoroalkyl-containing polymers and polytetrafluoroethylene.

The solvent used in the present invention is not particularly restricted providing it can dissolve a release agent, and general solvents such as, for example, hexane, pentane, hydrofluoro ether, decafluoropentane and the like can be used, and the solvent is preferably a solvent having no flammability such as hydrofluoro ether, difluoropentane or the like from the standpoints of safety and workability since a tablet forming machine may locally reach around 50° C. even if working environment for producing an encapsulating molding material tablet is under temperatures of about 20° C. By using a solvent having no flammability, reduction of safety equipments and decrease in check can be attained. Here, the solvent having no flammability is preferably a solvent manifesting no flammability at 20° C., and further preferably a solvent manifesting no flammability at 50° C. or more.

The use ratio of a release agent to a solvent is not particularly restricted providing a release agent is dissolved in a solvent, and from the standpoint of product property, the ratio of a release agent is preferably from 0.01 to 10 wt %, more preferably from 0.05 to 5 wt %, further preferably from 0.1 to 3 wt % based on a solvent.

The method of feeding a release agent dissolved in a solvent (hereinafter, referred to as "release agent solution") to the punch surface of a tablet forming machine to form a release agent layer on the punch surface is not particularly restricted, and there are listed general means such as painting coating such as baking painting and the like, spray coating of spraying by a spray nozzle and the like. From the standpoint of operability, spray coating is preferable. A release agent solution may be mixed with fluid such as air and the like and spray-coated. Feeding of a release agent solution to the punch surface is preferably conducted intermittently at suitable interval linking with the continuous molding action of a tablet forming machine.

The thickness of a release agent layer formed on the punch surface is required to be from 0.001 to 0.07 µm from the standpoints of releasability and poor appearance, and preferably from 0.01 to 0.02 µm from the standpoints of releasability and adhesion. Here, the thickness of a release agent layer means thickness obtained in one process of feeding a release agent solution, and is obtained from actually observed value or theoretical value. In the case of obtaining from theoretical value, the thickness can be calculated from the surface area of a punch, dilution ratio of a release agent in a solvent and feeding amount.

The release agent layer may be formed on a part of the punch surface, however, from the standpoint of releasability, the release agent layer is preferably formed on the whole punch surface, and more preferably formed uniformly on the punch surface.

As one examples of the method of producing an encapsulating molding material tablet of the present invention, a method of producing an encapsulating molding material tablet using a rotary type tablet forming machine 30 is illustrated in schematic views of FIG. 1, FIG. 2, FIG. 3 and FIG. 5. In the drawings, those elements having the same function are given the same reference numeral and explanation thereof is omitted. The tablet forming machine used in the present invention is not particularly restricted, and known tablet forming machines such as a hydraulic tablet forming machine and the like, other than the rotary type tablet forming machine 30 can be used.

Figure 2:
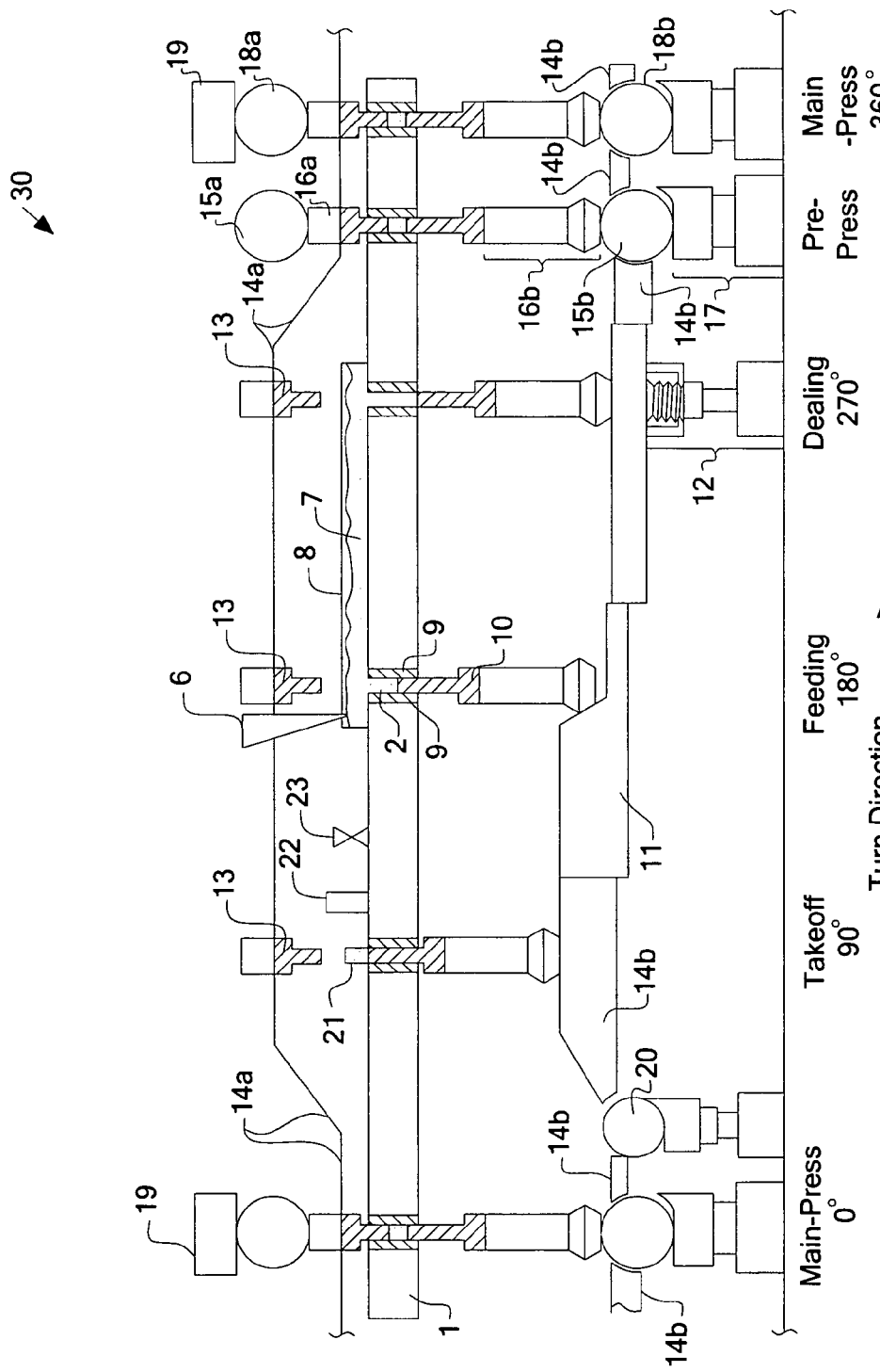
FIG. 2 is a view showing a process of producing an encapsulating molding material tablet using the side expansion view of a rotary type tablet forming machine 30.
Figure 3:
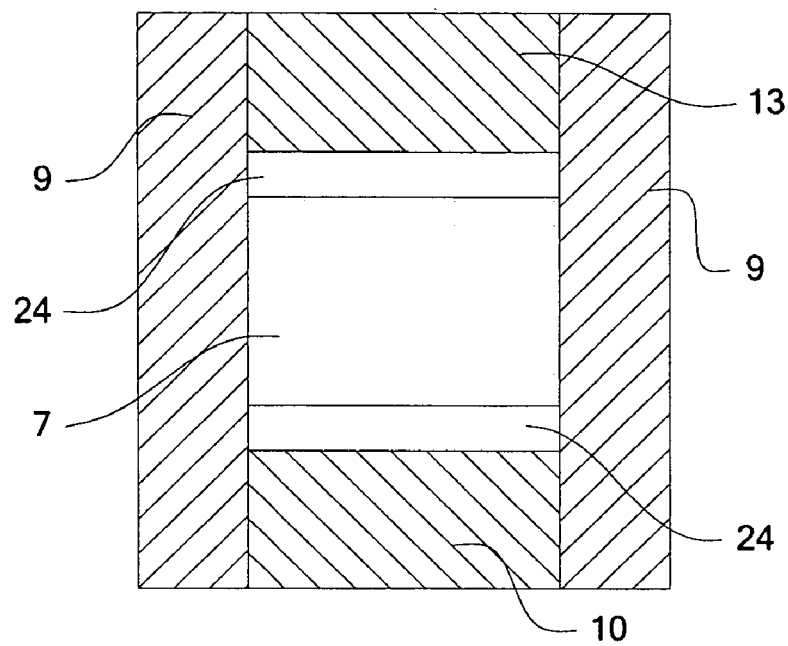
FIG. 3 is an enlarged longitudinal sectional view in a die 9 in processing an encapsulating molding material.
Figure 5:
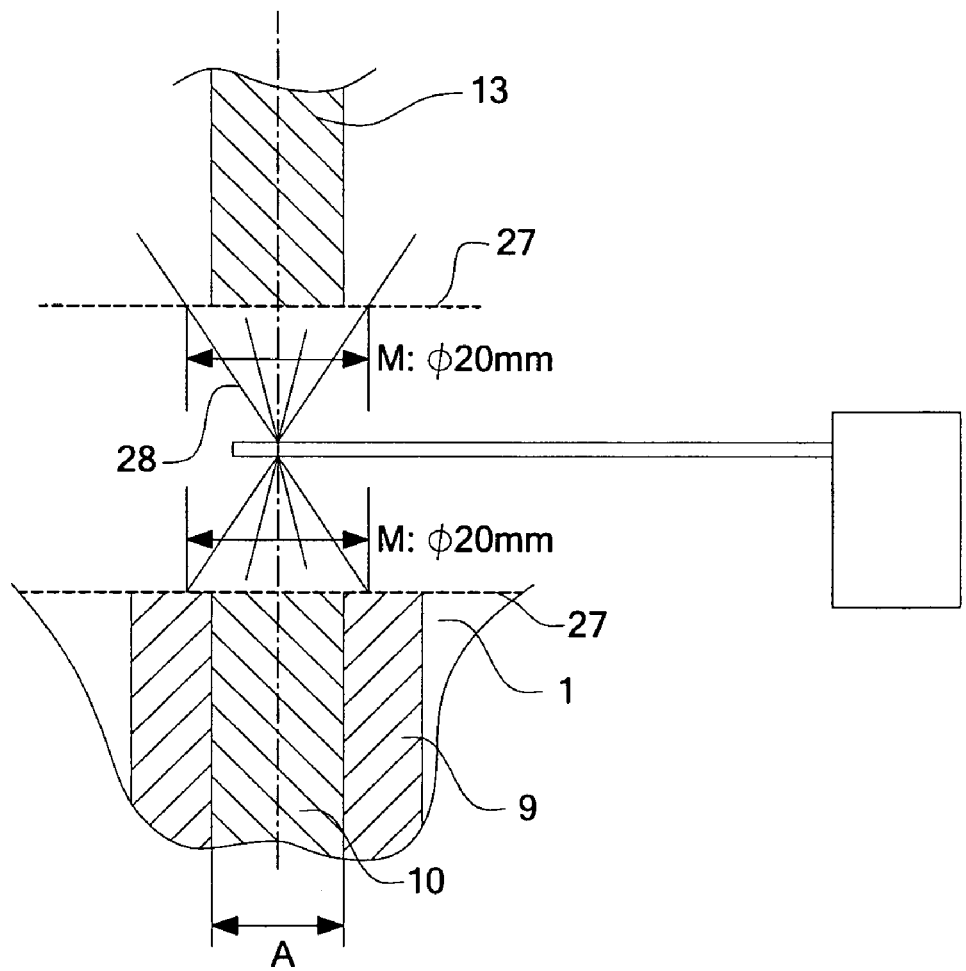
FIG. 5 is a view showing the condition of spraying of a release agent solution using partial sectional views of a turntable 1 and a die 9 of a rotary type tablet forming machine 30.

FIG. 1 is a top schematic view showing a process of producing an encapsulating molding material tablet of the rotary type tablet forming machine 30. FIG. 2 is an expanded side view showing a process of producing an encapsulating molding material tablet of the rotary type tablet forming machine 30. FIG. 5 is a partial sectional view showing the condition of spraying a release agent solution of a turntable 1 and a die 9 of the rotary type tablet forming machine 30. FIG. 3 is an enlarged longitudinal sectional view in the die 9 processing an encapsulating molding material. As illustrated in FIG. 3, a release agent layer 24 is formed on the contact surface of an upper punch 13 and a lower punch 10 with an encapsulating molding material.

As shown in FIGS. 1 and 2, the rotary type tablet forming machine 30 has a turntable 1 capable of rotating 360° in the direction of arrow in FIG. 1, and an upper punch 13 and a lower punch 10 are placed so that both punches can move following the movement of the turntable 1. The upper punch 13 and lower punch 10 are so placed that they face and sandwich a penetration port 2 provided at the edge of the turn table 1, and are so placed that they can move along rails 14a, b. Further, a release agent spraying apparatus 23, material feeding and dealing station 3, pressurizing station 5, and takeoff guide are provided in the rotary type tablet forming machine 30.

When the turntable 1 of the rotary type tablet forming machine 30 is rotated 360°, an encapsulating molding material tablet will be obtained through a process of feeding an encapsulating molding material, a dealing process, pre-press process, main-press process and takeoff process.

Next, the processes for the method of producing an encapsulating molding material tablet will be illustrated in more detail by explanations of parts of the rotary type tablet forming machine 30.

(0) Process of Feeding Release Agent to Punch Surface

Between a takeoff station and a material feeding station of the apparatus, a release agent spraying apparatus 23 is provided as shown in FIG. 5. During one rotation of the turntable 1, a release agent solution 28 is continuously sprayed, so as to feed the release agent solution 28 to respective punch surfaces of the upper punch 13 and the lower punch 10 passing. By this procedure, a release agent layer 24 is formed on the punch surfaces of the upper punch 13 and the lower punch 10 by the release agent solution 28 sprayed from the release agent spraying apparatus 23, as shown in FIG. 3.

The release agent solution 28 may be fed during each rotation of the turntable (at every formation of one tablet by an upper punch and lower punch) couple, or may be fed often several rotations. From the standpoint of workability, it is preferable that the release agent solution 28 is fed at a constant interval.

Though the release agent solution may be fed to at least one of the upper and lower punches, it is preferable to feed the release agent solution to both punch surfaces.

(1) Process of Feeding Encapsulating Molding Material

At the encapsulating molding material feeding station, a hopper 6 and a feed shoe 8 are provided, and an encapsulating molding material 7, fed through the hopper 6, is stored in the feed shoe 8. A lowering guide 11 is provided on the encapsulating molding material feeding station. The lower punch 10 moves vertically (as shown downwardly) passing an inclined surface of the lowering guide 11.

Therefore, when the lower punch 10 is moved vertically downward below the feed shoe 8, the punch surface is moved below the penetration port 2 by the lowering guide 11. Subsequently, the encapsulating molding material 7 is again introduced in the penetration port 2.

(2) Dealing Process

A dealing jack 12 is provided on a dealing station for controlling the height of the punch surface of the lower punch 10. By reciprocating the lower punch 10 with the dealing jack 12 so as to set the lower limit position of the lower punch 10, the dealing of the encapsulating molding material 7 is controlled.

(3) Pre-Press Process

On a pre-press station, a pre-press roll 15a and a pre-press roll 15b are placed on a supporting stand 17. In a main-press station described later, a main-press rolls 18a and 18b are also placed on the support stand 17.

When the upper punch 13 passes through the pre-press station, the upper punch 13 descends inside the penetration port along a rail 14, to pre-pressurize the encapsulating molding material 7. In this operation, the encapsulating molding material 7 is pressurized via a holder 16a by a pre-press roll 15a from the side of the upper punch 13, and receives pressure via a holder 16b by a pre-press roll 15b from the side of the lower punch 10.

Though not shown in order to provide easy understanding of the invention, the pre-press rolls 15a, 15b, and the main rolls 18a, 18b are held along an axis to the rotary type tablet forming machine 30.

(4) Main-Press Process

When the upper punch 13 and the lower punch 10 pass through the main-press station, the encapsulating molding material 7 in the die 9 is pressurized with a further increased of pressure which is greater than that of the pre-press station. By monitoring pressure applied in this operation by a load cell 19, vertical movement of the dealing jack 12 in the dealing process is controlled.

Here, the pressurizing condition in producing an encapsulating molding material tablet is not generally determined by the specifications of an encapsulating molding material tablet (size and the like, particularly, density), however, from the standpoint of obtaining a tablet of high density, higher pressure is desirable, and from the standpoints of the strength of a tablet forming machine and parts (frame and the like) and durability, a lower pressure is desirable. The pressurizing condition is preferably from 150 to 1000 MPa, more preferably from 250 to 700 MPa, further preferably from 300 to 600 MPa.

Further, the pressuring time, namely, time during which heads of the holders 16a, 16b are in contact with the pre-press rolls 15a, 15b and the main tolls 18a, 18b, is in inverse proportion with the number of revolutions. When revolutions are higher that is pressuring time is shorter, productivity is better; however, problems occur such as deterioration of the quality of a tablet (un-uniform density, appearance abrasion flaws of projection), friction of forming machine parts, and the like. The compress time is not generally determined since it varies depending on the size of a tablet forming machine and the like, however, in the rotary type tablet forming machine 30, the number of revolutions (revolution/min)/time (second) is preferably 5 to 25/0.05 to 0.25, more preferably 10 to 20/0.06 to 0.13, further preferably 13 to 17/0.07 to 0.10.

The temperature condition in the process of producing an encapsulating molding material tablet is, in view of maintenance of an encapsulating molding material tablet property, preferably from 15 to 30° C., more preferably from 18 to 28° C., further preferably from 20 to 25° C.

It is preferable that cooling water of 0 to 15° C. is fed into a turntable of a forming machine, and more preferably, cooling water of 3.0 to 7.0° C. is utilized.

(5) Takeoff Process

On a takeoff station, an extrusion roll 20 and a takeoff guide 22 for taking an encapsulating molding material tablet 21 out of the rotary type tablet forming machine 30, are provided.

As the result, when the lower punch 10 is passed through to extrusion roll 20, the encapsulating molding material tablet 21 is pushed quickly up to the upper part of the penetration port 2 by the extrusion roll 20. Then, the pushed-up encapsulating molding material tablet 21 is taken out of the rotary type tablet forming machine 30 through the takeoff guide 22.

By passing through the above-mentioned process, an encapsulating molding material tablet is obtained. According to the method of producing an encapsulating molding material tablet of the present invention, adhesion of an encapsulating molding material to the punch surface of a tablet forming machine is effectively prevented. Namely, a high quality encapsulating molding material tablet is obtained without defects in appearance, and the yield increases by improvement in workability.

The method of producing an encapsulating molding material tablet of the present invention has wide applicability and can be used under various production conditions, and suitably used particularly when the molding pressure in molding a tablet is increased and when a biphenyl type epoxy resin excellent in reflow crack resistance is used as an encapsulating molding material.

Since a release agent fed onto the punch surface of a forming machine adheres to a surface pressurized by a punch of an encapsulating molding material tablet, the contact angle to the punch pressurized surface of an encapsulating molding material tablet increases in proportion to the amount of release agent fed to the punch surface. In contrast, the cylindrical surface of an encapsulating molding material tablet is not affected by a sprayed release agent since it does not contact the punch surface. In the present invention, an encapsulating molding material tablet has a contact angle ratio, from the standpoints of releasability and appearance failure, of preferably 1.15 or more and less than 1.35, and in view of an influence on the encapsulating molding material property and economy, more preferably 1.18 or more and less than 1.28, and further preferably 1.20 or more and less than 1.25. Here, the contact angle ratio of an encapsulating molding material tablet is defined as a ratio of the contact angle of the pressurized surface by a punch of a forming machine to the contact angle of the cylindrical surface of an encapsulating molding material tablet. The contact angle refers the contact angle of water drop (4 μL) to each surface of an encapsulating molding material tablet, and can be measured by a general method using a contact angle meter and the like.

As the electronic part apparatus equipped with an element encapsulated using an encapsulating molding material tablet obtained in the present invention, listed are electronic part apparatuses in which elements such as active elements such as semiconductor chips, transistors, diodes, thyristors and the like, passive elements such as condensers, resistors, coils and the like are mounted on supporting members such as lead frames, wired tape carriers, wiring boards, glass, silicone wafers and the like and necessary portions are encapsulated with an encapsulating molding material tablet of the present invention, and other apparatuses. As such electron part apparatuses, there are listed, for example, resin encapsulation type IC such as DIP (Dual Inline Package), PLCC (Plastic Leaded Chip Carrier), QFP (Quad Flat Package), SOP (Small Outline Package), SOJ (Small Outline J-lead package) TSOP (This Small Outline Package), TQFP (Thin Quad Flat Package) and the like obtained by a semiconductor is fixed on a lead frame, and the lead portion and the end portion of an element such as a bonding pad and the like are connected by wire bonding or bump, then, encapsulation is carried out by transfer molding and the like using an encapsulating molding material tablet of the present invention; TCP (Tape Carrier Package) obtained by lead-bonding a semiconductor chip on a tape carrier and the encapsulating the chip using an encapsulating molding material tablet of the present invention; semiconductor devices carrying a bear chip mounted such as COB (Chip On Board), COG (Chip On Glass) and the like obtained by connecting a semiconductor chip to a wiring board or wiring formed in a glass plate by wire bonding, flip chip bonding, soldering and the like and encapsulating the chips using an encapsulating molding material tablet of the present invention; hybrid IC in which semiconductor chips connected to a wiring board or wiring formed on glass by wire bonding, flip chip bonding, soldering and the like, active elements such as transistors, diodes, thyristors and the like and/or passive elements such as condensers, resistors, coils and the like are encapsulated using an encapsulating molding material tablet of the present invention; BGA (Ball Grid Array), CSP (Chip Size Package), MCP (Multi Chip Package) and the like obtained by mounting a semiconductor chip on an interposer substrate having terminals formed for connecting a multi chip module, mother board, connecting the semiconductor chip and wiring formed in the interposer substrate by bump or wire bonding, then, encapsulating the side of semiconductor chip mounting using an encapsulating molding material tablet of the present invention. Also in print wiring boards, an encapsulating molding material of the present invention can be effectively used.

As the method of encapsulating an element using an encapsulating molding material tablet of the present invention, a low pressure transfer molding method is most general, however, an injection molding method, compression molding method and the like may also be used.

EXAMPLES

The following examples further illustrate the present invention, but do not limit the scope of the invention.
Preparation of encapsulating molding material 4.3 parts by weight of a biphenyl type epoxy resin having an epoxy equivalent of 196 and a melting point of 106° C. (manufactured by Japan Epoxy Resin K.K., tradename: YX-4000H), 0.8 parts by weight of a bisphenol A type brominated epoxy resin having an epoxy equivalent of 375, a softening point of 80° C. and a bromine content of 48 wt % (manufactured by Sumitomo Chemical Industry Co., Ltd., trade name: ESB-400T), 4.8 parts by weight of a phenolaralkyl resin having a softening point of 70° C. (manufactured by Mitsui Chemical Co., Ltd., tradename: MIREX XL-225), 0.2 parts by weight of triphenylphosphine, 88 parts by weight of a spherical fused silica having an average particle size of 17.5 μm and a specific surface area of 3.8 $m^2/g$, 0.3 parts by weight of antimony trioxide, 0.2 parts by weight of montanic acid ester (manufactured by Clariant), 0.2 parts by weight of carbon black (manufactured by Mitsubishi Chemical Co., Ltd., tradename: MA-100) and 0.5 parts by weight of γ-glycidoxypropyltrimethoxysilane (epoxysilane coupling agent) were compounded, and roll-kneaded under conditions of a kneading temperature of 100°

C. and a kneading time of 5 minutes, obtaining an encapsulating molding material in the form of sheet having thickness of 2 mm.

Examples 1 to 4, Comparative Examples 1 to 5

The resulted encapsulating molding material was cooled, ground by a hammer mill under normal temperature, then, encapsulating molding material tablets were produced using the rotary type tablet forming machine 30 shown in FIGS. 1 to 2. Regarding the size of the tablets, the diameter was 13 mm and the height was 15 mm.

The production of encapsulating molding material tablets was conducted at a room temperature of 20° C., at a feeding amount of an encapsulating molding material of 100 kg/hr, for 0.08 seconds under a pre-pressure of 200 MPa and for 0.08 seconds at a main-pressure of 600 MPa, at a revolution of 15/minute.

For feeding of a release agent solution, the centers of the both punch surfaces of the upper punch 13 and the lower punch 10 passing while rotation together with the turntable 1 were allowed to coincide, as shown in FIG. 5, and a release agent solution was sprayed at 0.2 MPa from a spraying portion of a release agent spraying apparatus 23 placed on the center line of both punch surfaces and at about the center point from both punch surfaces, at a width of φ20 mm for each punch surface.

Encapsulating molding material tablets of Examples 1 to 4 and Comparative Examples 1 to 4 were produced, changing the kind of a release agent solution, the thickness of a release agent layer and the frequency of feeding of a release agent solution (once per five revolutions (shots) in Examples 1 to 3 and Comparative Examples 2, 3, one per three revolutions in Example 4, and once per one revolution in Comparative Examples 1 and 4). Further, without using a release agent solution, an encapsulating molding material tablet of Comparative Example 5 was produced. The thickness of a release agent layer on the punch surface was measured as described below, supposing a spray surface generating in rotation of a turntable, on a plane 27 containing the punch surface, and hypothesizing that a release agent solution is fed to the punch surface, at this area ratio of the whole spray area to the punch surface area.

Thickness of release agent layer (μm)=$(K \times L)/((A/2)^2 \times \pi) \times 10^6$ (wherein, K represents the release agent solution amount per one punch, L represents the volume ratio of a release agent in a release agent solution, and A represents the punch diameter (mm). K. L can be obtained from the following formulae.

$$K = (D \times (A/2)^2 \times \pi \times B/(C \times M)/E)/F$$

$$L = (G/H)/(I/J + G/H)$$

Here, A represents the punch diameter (mm), B represents the number of punch per one round of turntable (33), C represents the length of rotation circumference (640 mm×π, at the center of punch), D represents the spray amount of a release agent solution (ml/min), E represents spray revolution (rpm), F represents the total punch number sprayed per one round of turntable (33×2 (upper and lower)), G represents the amount (parts by weight) of a release agent, H represents the density (g/ml) of a release agent, I represent the amount of a solvent (parts by weight) J represents the density (g/ml) of a solvent, and M represents the spray diameter (20 mm) of a release agent solution to the plane 27 containing the punch surfaces of the lower punch 10 and the upper punch 13.

The encapsulating molding material tablets in the examples and the comparative examples were evaluated as described below. The evaluation results are shown in Table 1.

TABLE 1

| | | Evaluation result | | | | | | | |
|---|---|---|---|---|---|---|---|---|---|
| | | Example | Comparative Example | | | Example | | Comparative Example | Example | Comparative Example |
| Evaluation item | | 1 | 1 | 2 | 3 | 2 | 3 | 4 | 4 | 5 |
| Release agent | | Carboxyl group-modified punchmthylpolysiloxane | | | | Perfluoroalkyl-containing polymer | | | Polytetrafluoroethylene | None |
| Solvent | | Hexane | | | Pentane | Hydrofluoro ether | | | Hydrofluoro ether | None |
| Thickness of release agent layer (μm) | | 0.02 | 0.001 | 0.07 | 0.29 | 0.016 | 0.025 | 0.001 | 0.02 | 0 |
| Contact angle ratio | | 1.22 | 1.13 | 1.35 | 1.41 | 1.21 | 1.25 | 1.14 | 1.20 | 1.02 |
| Number of shot until generation of adhesion | Tabletting by intermittent spray (spray number/tabletting number) | >10000 (1/5) | 40 (1/1) | >10000 (1/5) | >10000 (1/5) | >10000 (1/5) | >10000 (1/5) | 40 (1/1) | >10000 (1/3) | 10 (no spray) |
| Appearance of encapsulating molding material tablet | | ○ | ○ | X | X | ○ | ○ | ○ | ○ | ○ |
| Adhesion (N/m) | | 80 | 80 | 80 | Not measured | 80.9 | 76 | 80.1 | 80.5 | 80.1 |

<Evaluation Method>

(1) Adhesion of Encapsulating Molding Material to Punch Surface

The punch surface of a tablet forming machine was visually observed, and adhesion was evaluated by the shot number at which adhesion of an encapsulating molding material occurred for the first time.

(2) Appearance of Encapsulating Molding Material Tablet

The appearance of an encapsulating molding material tablet produced before observation of the adhesion of an encapsulating molding material to the punch surface described in (1) was visually observed, and swelling or stain believed to be a residue of release agent was judged as poor (x), and others were judged as good (O).

(3) Adhesion

The encapsulating molding material tablet used for the above-mentioned appearance evaluation of (2) was used and molded by a transfer molding machine under conditions of a mold temperature of 180° C., a molding pressure of 6.9 MPa and a hardening time of 90 seconds and post-hardened at 180° C. for 5 hours to produce DIP16 pin package onto which a silicone chip of 8 mm×10 mm×0.4 mm was adhered using 0.3 mmg (thickness: 20 μm) of a temporal tacking agent (Lock Tight), then, peeled toward cross direction under a head speed of 30 mm/min, and the strength (peel strength: N/m) was measured.

(4) Contact Angle Ratio

Using the encapsulating molding material tablet on which the above-mentioned appearance evaluation of (2) had been performed, measurement of contact angle was conducted by a contact angle meter FACE CA-Z type manufactured by Kyowa Kaimen Kagaku K.K. according to JIS R3257 "test method of wettability of substrate glass surface".

Figure 4:
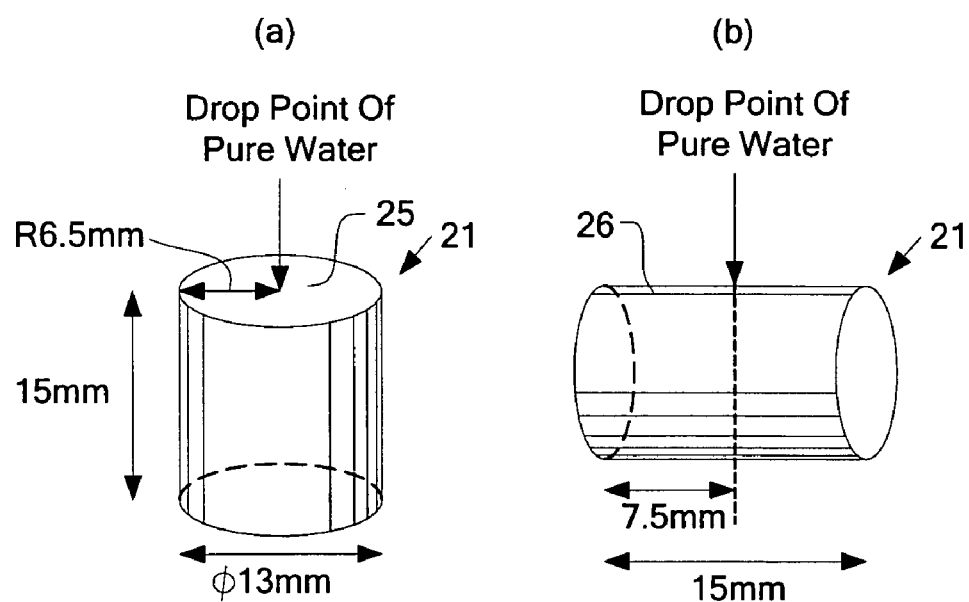
FIG. 4 is a schematic view showing a method of measuring the contact angle of an encapsulating molding material tablet.

First, the contact angle of the pressurized surface by a punch of a forming machine, of the encapsulating molding material tablet was measured. As shown in FIG. 4(a), the pressurized surface 25 by a punch of a forming machine of the encapsulating molding material tablet 21 was placed horizontally, and a pure water drop of 4 μL was placed on the center thereof, and the contact angle was measured.

Next, the contact angle on the cylindrical surface of the encapsulating molding material tablet 21 was measured. As shown in FIG. 4(b), the cylindrical surface 26 of the encapsulating molding material tablet 21 was placed horizontally, a pure water drop of 4 μL was placed tenderly on the uppermost part at the center of horizontal direction, and the contact angle was measured by the shape of a water drop formed on the vertical surface including the uppermost part of the cylindrical surface 26.

The measured value of the contact angle on the pressurized surface by a punch of a forming machine of the encapsulating molding material tablet was divided by the measured value of the contact angle on the cylindrical surface of the encapsulating molding material tablet, to give the contact angle ratio of the encapsulating molding material tablet.

In Comparative Example 5 in which a release agent solution is not fed to the punch surface of a tablet forming machine, and in Comparative Examples 1 and 4 in which the thickness of a release agent layer is smaller than the range defined in the present invention, adhesion of an encapsulating molding material to the punch surface is remarkably poor. In Comparative Examples 2 and 3 in which the thickness of a release agent layer is over the range defined in the present invention, an effect was found on decrease of adhesion of an encapsulating molding material to the punch surface, however, the poor appearance (stain) of the encapsulating molding material tablet occurs.

In contrast, in any of Examples 1 to 4, poor appearance of the encapsulating molding material tablet did not occur, and the adhesion of an encapsulating molding material to the punch surface of a tablet forming machine could be decreased. In particular, it was found that also adhesion is excellent in Examples 1, 2 and 4 in which the thickness of a release agent layer is 0.01 μm to 0.02 μm on the punch surface.

INDUSTRIAL APPLICABILITY

In the method of producing an encapsulating molding material tablet according to the present invention, adhesion of an encapsulating molding material to the punch surface in tablet molding can be decreased without generating poor appearance, and if an element is encapsulated using an encapsulating molding material tablet produced by this production method, an electron part apparatus excellent in reliability can be obtained, therefore, its industrial value is large.

The invention claimed is:

1. A method of producing an encapsulating molding material tablet comprising:
   feeding an encapsulating molding material to a forming metal die, and
   compressing the encapsulating molding material by upper and lower punches of the forming metal die,
   wherein a contact surface of at least one of the upper and lower punches, being the surface thereof closest to the encapsulating molding material, has thereon a release agent layer having a thickness greater than 0.001 μm and less than 0.07 μm.

2. The method of producing an encapsulating molding material tablet according to claim 1, wherein the release agent contains at least one of fluorine-based release agents and silicone-based release agents.

3. The method of producing an encapsulating molding material tablet according to claim 2, wherein the fluorine-based release agent is at least one of perfluoroalkyl-containing polymers and polytetrafluoroethylene.

4. The method of producing an encapsulating molding material tablet according to claim 2, wherein the silicone-based release agent is carboxyl group-modified dimethylpolysiloxane.

5. The method of producing an encapsulating molding material tablet according to claim 2, wherein a release agent dissolved in a solvent is fed to the contact surface, of the at least one of the upper and lower punches, with the encapsulating molding material, to provide a release agent layer.

6. The method of producing an encapsulating molding material tablet according to claim 5, wherein the solvent has no flammability.

7. An encapsulating molding material tablet produced by the production method according to claim 5.

8. An encapsulating molding material tablet produced by the production method according to claim 2.

9. The method of producing an encapsulating molding material tablet according to claim 1, wherein a release agent dissolved in a solvent is fed to the contact surface, of the at least one of the upper and lower punches, with the encapsulating molding material, to provide a release agent layer.

10. The method of producing an encapsulating molding material tablet according to claim 9, wherein the solvent has no flammability.

11. An encapsulating molding material tablet produced by the production method according to claim 9.

12. The method of producing an encapsulating molding material tablet according to claim 9, wherein a solution of the release agent on the solvent includes 0.01 to 10 wt % of the release agent, based on the solvent.

13. The method of producing an encapsulating molding material tablet according to claim 12, wherein a solution includes 0.1 to 3 wt % of the release agent, based on the solvent.

14. An encapsulating molding material tablet produced by the production method according to claim 1.

15. An electronic part apparatus equipped with an element encapsulated using the encapsulating molding material tablet according to claim 14.

16. The encapsulating molding material tablet according to claim 14, wherein the contact angle ratio is greater than 1.15 and less than 1.35.

17. The encapsulating molding material tablet according to claim 14, comprising: (A) a thermosetting resin, (B) a hardener and (C) an inorganic filler.

18. The method of producing an encapsulating molding material tablet according to claim 1, wherein the encapsulating molding material tablet has a contact angle ratio of greater than 1.15 and less than 1.35.

19. The method of producing an encapsulating molding material tablet according to claim 1, including the further step of forming the release agent layer on said contact surface.

20. The method of producing an encapsulating molding material tablet according to claim 19, wherein the release agent layer is formed by painting or by spray coating.

21. The method of producing an encapsulating molding material tablet according to claim 19, wherein said release agent layer is formed intermittently, and tablets are formed continuously by the forming metal die.

22. The method of producing an encapsulating molding material tablet according to claim 19, wherein said thickness of said release agent layer is from 0.01 to 0.02 µm.

23. An encapsulating molding thermosetting resin material tablet having a contact angle ratio of at least 1.15 and less than 1.35.

24. The encapsulating molding thermosetting resin material tablet according to claim 23, comprising: (A) a thermosetting resin, (B) a hardener and (C) an inorganic filler.

25. An electronic part apparatus equipped with an element encapsulated using the encapsulating molding thermosetting resin material tablet according to claim 23.

26. The encapsulating molding thermosetting resin material tablet according to claim 23, wherein said contact angle ratio is 1.18 or more and less than 1.28.

27. The encapsulating molding thermosetting resin material tablet according to claim 23, wherein said contact angle ratio is 1.20 or more and less than 1.25.

* * * * *